US006458613B1

United States Patent
Bae

(10) Patent No.: US 6,458,613 B1
(45) Date of Patent: Oct. 1, 2002

(54) METHOD FOR MANUFACTURING A LIQUID CRYSTAL DISPLAY USING A SELECTIVE ETCHING METHOD

(75) Inventor: Sung Sik Bae, Ahnyang Shi (KR)

(73) Assignee: LG Electronics, Inc., Seoul (KR)

( * ) Notice: Subject to any disclaimer, the term of this patent is extended or adjusted under 35 U.S.C. 154(b) by 0 days.

(21) Appl. No.: 09/184,825

(22) Filed: Nov. 2, 1998

(30) Foreign Application Priority Data

Oct. 31, 1997 (KR) ............................................. 97-57079

(51) Int. Cl.[7] ........................ H01L 21/00; H01L 21/302; H01L 21/461
(52) U.S. Cl. .......................... 438/30; 438/714; 438/723; 438/724
(58) Field of Search .......................... 438/30, 706, 712, 438/714, 723, 724; 216/41–51, 58, 72, 79, 80

(56) References Cited

U.S. PATENT DOCUMENTS

| | | | | |
|---|---|---|---|---|
| 4,371,407 A | * | 2/1983 | Kurosawa .................... | 148/187 |
| 4,849,375 A | * | 7/1989 | Gluck et al. ................. | 437/225 |
| 5,002,902 A | * | 3/1991 | Wantanabe .................. | 437/235 |
| 5,236,870 A | * | 8/1993 | Sakata et al. ................ | 437/195 |
| 5,310,454 A | * | 5/1994 | Ohiwa et al. ................ | 156/643 |
| 5,491,099 A | * | 2/1996 | Hsu ............................ | 437/35 |
| 5,659,329 A | * | 8/1997 | Yamanobe et al. ........... | 345/74 |
| 5,892,269 A | * | 4/1999 | Inoue et al. ................. | 257/634 |
| 5,898,221 A | * | 4/1999 | Mizuhara et al. ........... | 257/751 |
| 5,939,824 A | * | 8/1999 | Kishi et al. ................. | 313/495 |
| 5,946,065 A | * | 8/1999 | Tagusa et al. ............... | 349/138 |

FOREIGN PATENT DOCUMENTS

| | | |
|---|---|---|
| JP | 1281435 | 11/1989 |
| JP | 5267239 | 10/1993 |

* cited by examiner

*Primary Examiner*—Olik Chaudhuri
*Assistant Examiner*—Erik Kielin
(74) *Attorney, Agent, or Firm*—Birch, Stewart, Kolasch & Birch, LLP

(57) ABSTRACT

An etching method for manufacturing a liquid crystal display having TFTs, gate bus lines, data bus lines which include a refractory metal such as Mo, Ta, Ti, MoSi, TaSi or TiSi, and a passivation layer covering such layers, is such that refractory metal is not damaged by an etchant used for patterning the passivation layer. The method includes forming a passivation layer covering the switching element, the gate bus line and the data bus line on the substrate, forming a patterning layer on the passivation layer using a photoresist wherein the patterning layer has open portions exposing some portions of the passivation layer on the switching element and a start portion of the gate and data bus lines, and removing the exposed portions of the passivation layer using an etching gas including $CF_4$ and $H_2$ gases. A mixing ratio of the $H_2$ gas to the $CF_4$ gas is varied and dependent on the area of the portion of the passivation layer to be removed and is preferably about 1% to about 20%.

10 Claims, 7 Drawing Sheets

METHOD FOR MANUFACTURING A LIQUID CRYSTAL DISPLAY USING A SELECTIVE ETCHING METHOD

BACKGROUND OF THE INVENTION

1. Field of the Invention

The present invention relates to a manufacturing method for a liquid crystal display device using a selective etching method. More specifically, the present invention relates to an etching method for manufacturing a liquid crystal display having a TFT (thin film transistor), gate bus lines, data bus lines which include a refractory metal such as Mo, Ta, Ti, MoSi, TaSi or TiSi, and a passivation layer covering them, wherein the refractory metal is not damaged by the etchant used for forming the passivation layer.

2. Description of the Background Art

Generally, a thin film type liquid crystal display device includes a lower plate, an upper plate joined to the lower plate, and a liquid crystal disposed therebetween. At the outer portions of the two connected plates, polarizing plates are attached. That is, the upper plate includes an inner side having a color filter and a common electrode, and an outer side having a polarizing plate. The lower plate includes an outer side having a polarizing plate as well, and an inner side having a plurality of gate bus lines 20 and data bus lines 10 arranged perpendicular to and crossing with each other, and a pixel electrode 55 positioned at an inner space defined by the crossed gate bus lines 20 and the data bus lines 10, as shown in FIG. 1. That is, a plurality of the gate bus lines 20 are arranged to extend in a horizontal direction on the lower plate, and gate electrodes 21 are extended from the gate bus lines 20. A plurality of the data bus lines 10 are arranged to extend perpendicularly to the gate bus lines 20 and source electrodes 11 are extended from the data bus lines 10. Drain electrodes 31 facing the source electrodes 11 are disposed so that the TFT switching elements, including the gate electrodes 21, the source electrodes 11 and the drain electrodes 31, are completed.

To drive the LCD, each data bus line 10 is connected to an output of a signal driver IC generating the data signal of the picture, and each gate bus line 20 is connected to a output of a scan driver IC generating the scan signal of the picture.

A process to manufacture the lower plate of the LCD is explained below referring to FIGS. 1 to 4c. FIG. 1 is a plane view showing the lower plate of a conventional liquid crystal display device. FIGS. 2a–2c, 3a–3c, and 4a–4c are cross-sectional views showing a conventional method for etching the passivation layer covering a switching element as denoted by line a—a in FIG. 1, a gate pad 22 as denoted by line b—b, and data pad 12 as denoted by line c—c, respectively.

As shown in the figures, the lower plate 1 is formed using a transparent insulating substrate such as glass. On the lower plate 1, a metal layer including molybdenum (Mo) is deposited by sputtering. A plurality of gate bus lines 20 extending in the horizontal direction and a plurality of gate electrodes 21 extending from the gate bus lines 20 are formed by patterning the molybdenum metal layer on the lower plate 1. A gate pad 22 is formed at a start end of each gate bus line 20 for connection to the output of the scan driver IC generating the scan signal of the picture.

As shown in FIGS. 2a–2c, the lower plate includes a gate insulation layer 23, such as $SiN_x$ or $SiO_x$ disposed thereon. Such layer has a good adhesive property with an amorphous silicon and high insulating property.

On the gate insulation layer 23, an amorphous silicon (a-Si) or CdSe is deposited and patterned to form a semiconductor layer 13. On the semiconductor layer 13, an ohmic contact layer 14 is formed for providing a good ohmic contact between the semiconductor layer 13 and the source electrode 11 and the drain electrode 31.

On the entire surface of the lower plate 1 after the above mentioned processes have been completed, a metal layer including molybdenum, is deposited by sputtering and patterned to form a plurality of data bus lines 10 extending in the vertical direction as shown in FIG.1. Near the intersections of the gate bus lines 20 and the data bus lines 10, the source electrode 11 extends from the data bus line 10 and contacts one side of the ohmic contact layer 14, and the drain electrode 31 faces the source electrode 11 and contacts the other side of the ohmic contact layer 14. The data pad 12 is formed at the start end of each data bus line 10 for connection to the output of the signal driver IC generating the data signal of the picture supplied to the LCD.

After performing the above mentioned processing, a TFT switching element, which includes the gate electrode 21, the semiconductor layer 13, the source electrode 11 and the drain electrode 31, is formed.

Over the switching element, a passivation layer 40 is formed by depositing and/or coating an insulating layer including a Si bonding structure such as $SiN_x$, $SiO_x$, or BCB (Benzocycobutene), as shown in FIG. 2a. As shown in FIGS. 2b, 3b, and 4b after coating a photo-resist 60 on the passivation layer 40 using a spin coating method, the photo-resist 60 is patterned by exposure using a mask. Here, the patterned photo-resist 60 covers the entire surface of the passivation layer 40 except surface portions covering the drain electrode 31, the gate pad 22 and the data pad 12.

As a result of etching the lower plate 1 including the patterned photo-resist 60 in the etching chamber using $SF_6+O_2$ or $CF_4+O_2$ as an etching gas to remove the uncovered portion of the passivation layer 40, a contact hole 50 is formed. Through the contact hole 50, a portion of the drain electrode 31 as shown in FIGS. 2b and 2c is exposed. The passivation layer 40 uncovered by the photo-resist 60 over the gate pad 22 and the data pad 12 is also etched by the etching gas such as $SF_6+O_2$ or $CF_4+O_2$ so that the pads 12 and 22 are exposed as shown in FIGS. 3b–3c and 4b–4c, respectively. All of the photo-resist 60 is removed by the etching gas, $SF_6+O_2$ or $CF_4+O_2$.

An ITO (Indium Tin Oxide) layer is deposited via sputtering on the entire surface of the passivation layer 40 having the contact hole 50. On the ITO layer, a photo-resist is coated via a spin coating method and is then patterned. By etching the lower plate 1 having the patterned photo-resist using an etching solution such as HCl, pixel electrodes and terminals contacting pads 12 and 22 are formed. After that, the remaining photo-resist on the lower plate 1 is removed using an organic solution including NMP (N-Methyl-Pyrrolidone), alcohol and amine.

Through the terminals, the gate pad 22 is connected to the output of the scan driver IC and the data pad 12 is connected to the output of the signal driver IC.

According to the conventional method for manufacturing the LCD as described above, the step of exposing the drain electrode 31 is explained below in greater detail with reference to FIGS. 2b and 2c. The etching process for the passivation layer 40 is performed by a chemical reaction in which the F radical of the $SF_6+O_2$ or $CF_4+O_2$ gas reacts with the $Si_4^+$ of the passivation layer 40 to form a volatile gas such as a $SiF_4$. Therefore, the portions of the passivation layer 40 that are not covered by the photo-resist 60 react with the $SF_6+O_2$ or $CF_4+O_2$ gas to form a volatile $SiF_4$ gas so that these portions are removed. However, a portion of the drain electrode 31 is also exposed as shown in FIG. 2b. Unfortunately, the molybdenum of the drain electrode 31 easily reacts with the $SF_6+O_2$ or $CF_4+O_2$ gas used for etching the passivation layer 40. Therefore, the exposed portion of the drain electrode 31 is damaged by etching when the passivation layer is etched, as shown in FIG. 2c.

Referring to FIGS. 3a and 3b, the process for exposing the gate pad 22 is explained below in detail. As mentioned above, the portion of the passivation layer 40 located over the gate pad 22 is removed by the chemical reaction in which the $SF_6+O_2$ or $CF_4+O_2$ gas reacts with the passivation layer 40 to form a volatile gas such as a $SiF_4$. Then, the gate insulating layer 23 including $SiN_x$, or $SiO_x$ under the passivation layer 40 is removed by the same chemical reaction. Here, the gate pad 22 can be exposed to the $SF_6+O_2$ or $CF_4+O_2$ gas. As a result, the gate pad 22 including molybdenum is also easily damaged by the $SF_6+O_2$ or $CF_4+O_2$ gas, as shown in FIG. 3c.

Referring to FIGS. 4a and 4b, the process for exposing the data pad 12 is explained below in detail. As mentioned above, the portion of the passivation layer 40 located over the data pad 12 is removed by the chemical reaction in which the $SF_6+O_2$ or $CF_4+O_2$ gas reacts with the passivation layer 40 to form a volatile gas such as a $SiF_4^+$, as shown in FIG. 4b. As a result, the data pad 12 is exposed to the $SF_6+O_2$ or $CF_4+O_2$ gas and the data pad 12 including molybdenum is easily damaged by the $SF_6+O_2$ or $CF_4+O_2$ gas, as shown in FIG. 4c.

SUMMARY OF THE INVENTION

To overcome the problems described above, preferred embodiments of the present invention provide a method for etching a passivation layer while preventing any damage to an exposed metal layer.

According to a preferred embodiment of the present invention, a method for etching a passivation layer uses a $CF_4+H_2$ gas instead of the $SF_6+O_2$ or $CF_4+O_2$ gas used in conventional methods. As a result, preferred embodiments of the present invention provide an etching method in which a passivation layer 40 and a metal layer including molybdenum have different etching ratios relative to the etching gas including the $CF_4+H_2$ gas to thereby remove an insulation layer via the etching gas including an F radical and prevent damage from being caused to the exposed metal layer by the etching gas.

According to another preferred embodiment of the present invention, a method for manufacturing a lower plate of an LCD including a switching element having a gate electrode, a source electrode and a drain electrode, a data bus line connected to the source electrode of the switching element and a gate bus line connected to the gate electrode of the switching element includes the steps of forming a passivation layer covering the switching element, the gate bus line and the data bus line on the lower substrate, forming a patterning layer on the passivation layer via coating and patterning a photo-resist wherein the patterning layer has open portions exposing some portions of the passivation layer on the drain electrode, a start portion of the gate and data bus lines, removing the exposed portions of the passivation layer using an etching gas comprising $CF_4$ and $H_2$ gases, and removing the patterning layer on the passivation layer. In preferred embodiments of the present invention, a mixing ratio of the $H_2$ gas to the $CF_4$ gas is varied depending on the area of the portion of the passivation layer to be removed. In a specific preferred embodiment, the mixing ratio of the $H_2$ gas to the $CF_4$ is about 1% to about 20%.

According to preferred embodiments of the present invention, the passivation layer includes an insulating material having an Si bonding structure such as $SiN_x$, $SiO_x$ or BCB. The gate and data bus lines, the gate, source and drain electrodes include at least one layer selected from a refractory metal such as Mo, Ta, Ti, MoSi, TaSi or TiSi and stacked metal layers including an aluminum layer and a layer made of the refractory metal.

According to preferred embodiments of the present invention, the etching gas for removing the exposed portions of the passivation layer further includes at least one of $SF_6+CHF_3$, $CF_4+CHF_3$, $CF_4+H_2+He$ and $CF_4+H_2+N_2$.

These and other elements, features, and advantages of the preferred embodiments of the present invention will be apparent from the following detailed description of the preferred embodiments of the present invention, as illustrated in the accompanying drawings.

BRIEF DESCRIPTION OF THE ATTACHED DRAWINGS

The present invention will become more fully understood from the detailed description given herein below and the accompanying drawings which are given by way of illustration only, and thus are not limitative of the present invention, and wherein.

Figure 6A:
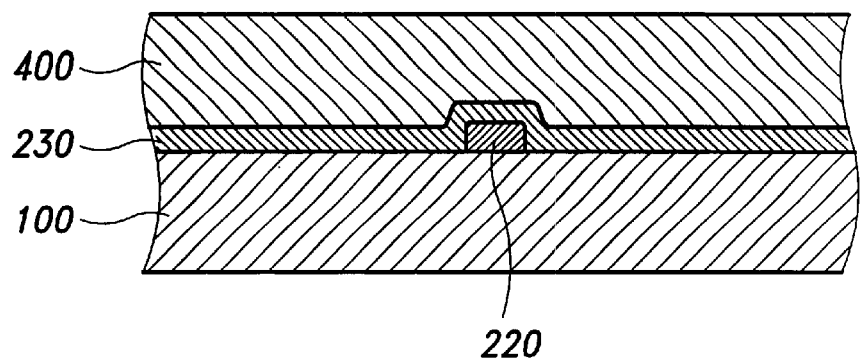
Figure 6B:
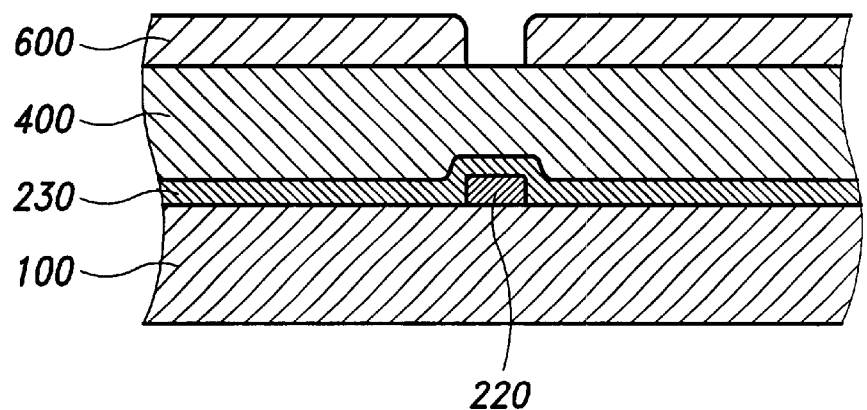
Figure 6C:
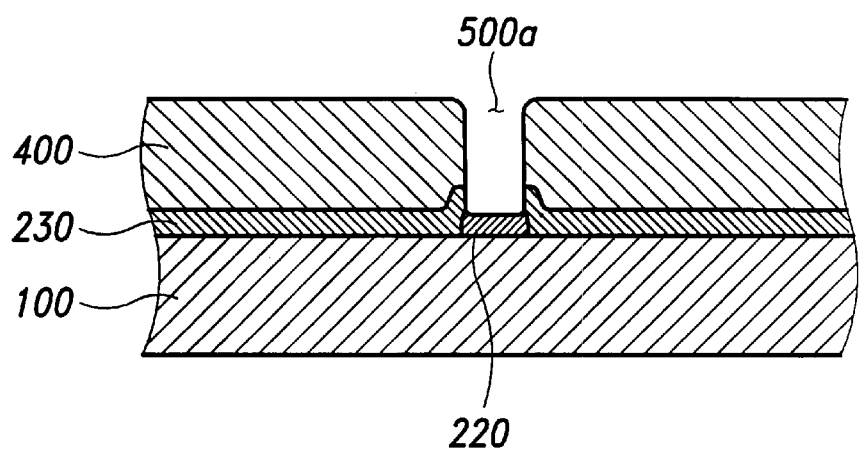
Figure 7A:
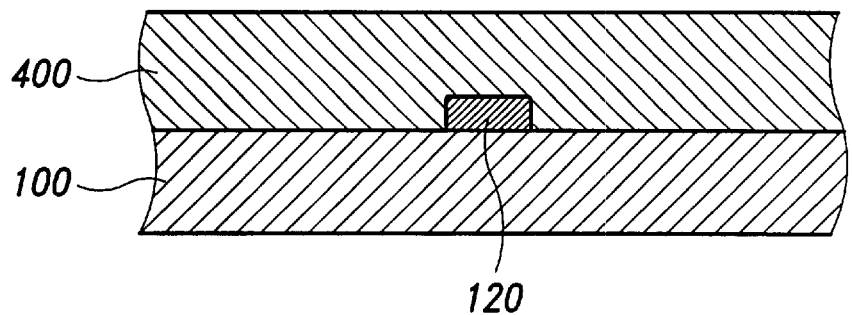
Figure 7B:
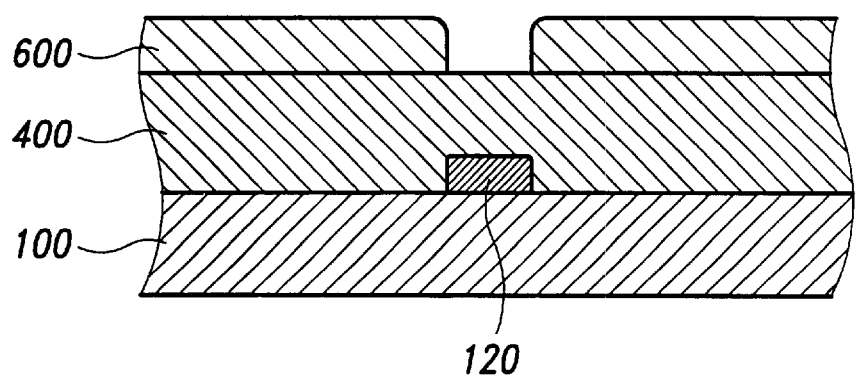
Figure 7C:
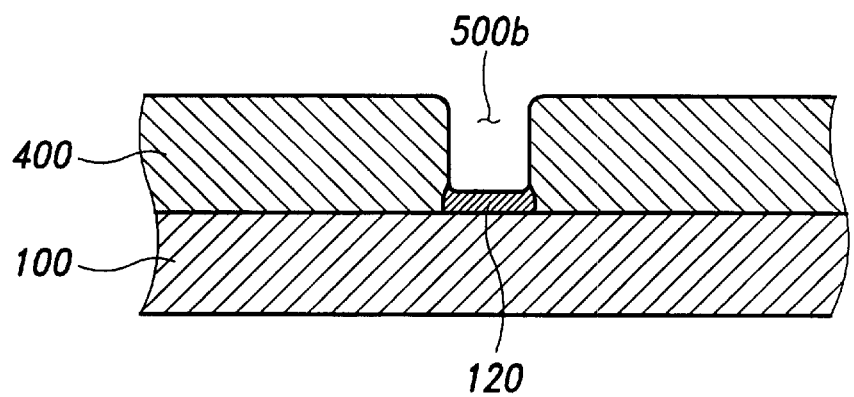

FIGS. 6a–6c show cross-sectional views for explaining a method for etching the passivation layer covering the gate pad of the liquid crystal display according to the preferred embodiment of the present invention; and FIGS. 7a–7c show cross-sectional views for explaining a method for etching the passivation layer covering the data pad of the liquid crystal display according to the preferred embodiment of the present invention.

DETAILED DESCRIPTION OF PREFERRED EMBODIMENTS

Referring to the figures, a preferred embodiment of the present invention will be explained in detail. FIGS. 5a–7c are cross-sectional views illustrating a method for etching the passivation layer according to the preferred embodiment of the present invention.

A lower plate 100 is preferably formed using a transparent insulating material such as glass. A refractory metal including at least one of Mo, Ta, Ti, MoSi, TaSi and TiSi is deposited on the lower plate 100. A plurality of gate bus lines (not shown) extending in the horizontal direction are formed by etching the refractory metal. At the same time, a gate electrode 210 (FIGS. 5a–5c) extending from the gate line is formed. At the start portion of the gate line, a gate pad 220 (FIGS. 6a–6c) is formed and is connected to the output of the scan driver IC for generating a scan signal of the picture data.

A gate insulating layer 230 is formed on the lower plate 100 including the gate bus line, the gate electrode 210 and the gate pad 220 by depositing an insulating material such as $SiN_x$ or $SiO_x$ having a good adhesive property and a high insulating property.

A semiconductor layer 130 is formed by depositing and patterning an amorphous silicon or CdSe on the gate insulating layer 230. An ohmic contact layer 140 is formed for providing an ohmic contact between the semiconductor layer 130 and a source electrode 110 or a drain electrode 310, on the semiconductor layer 130.

Figure 1:
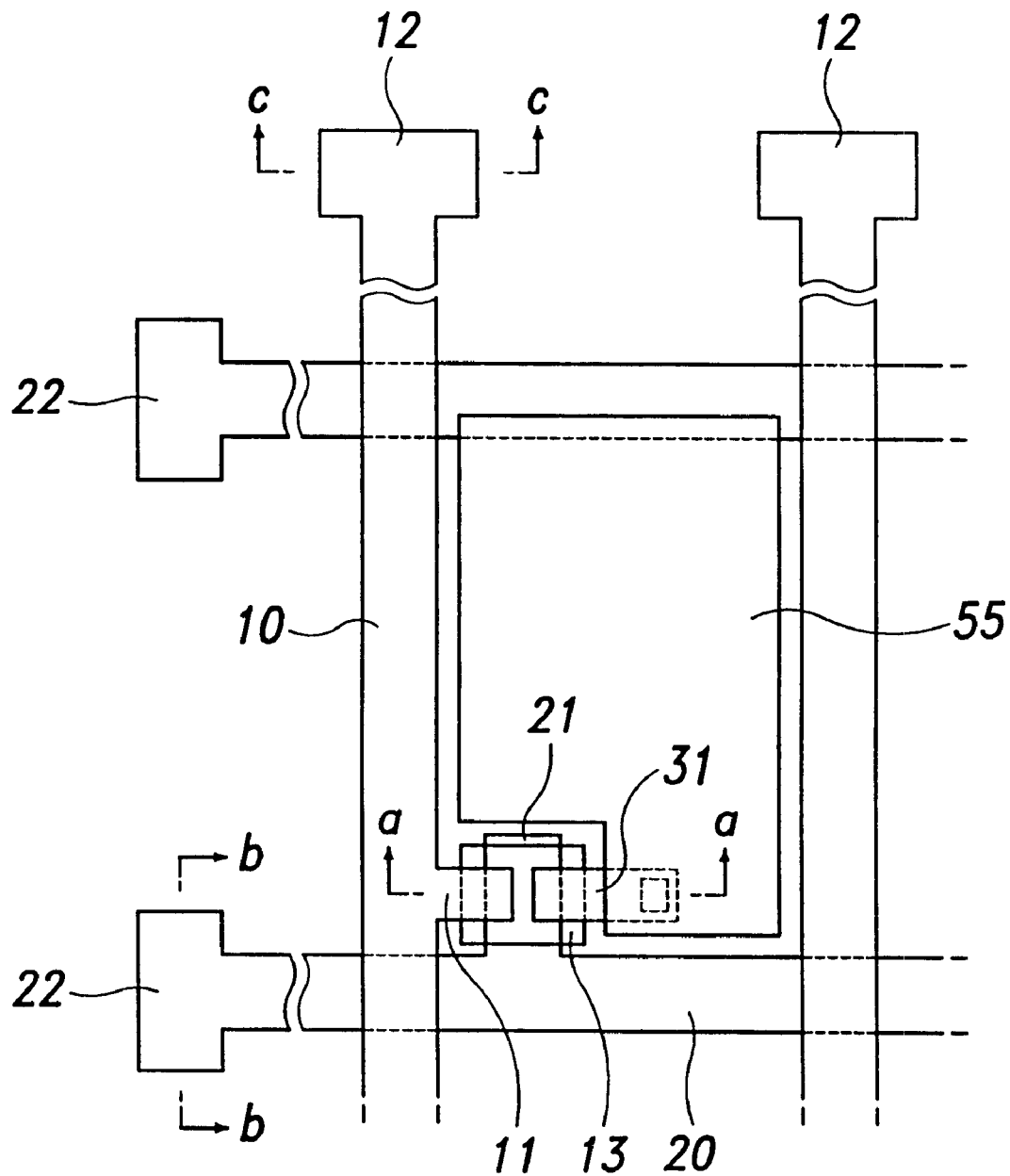
FIG. 1 is a plane view showing the lower plate of the conventional liquid crystal display device.
Figure 2A:
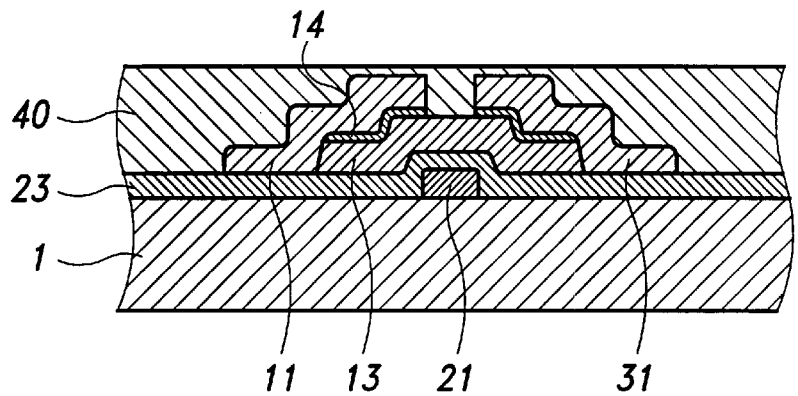
FIGS. 2a–2c show cross-sectional views for explaining a conventional method for etching the passivation layer covering the switching element of the liquid crystal display as denoted by the line a—a of FIG.1.
Figure 2B:
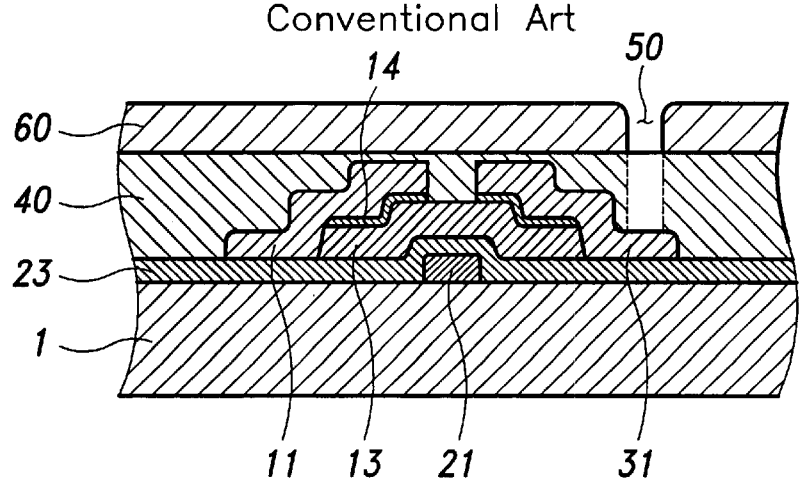
Figure 2C:
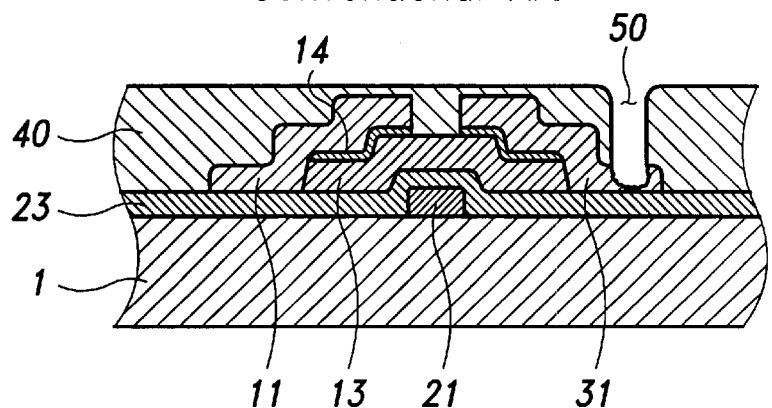
Figure 3A:
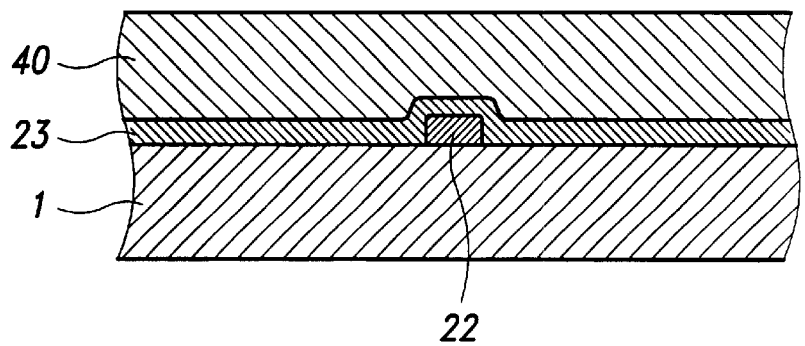
FIGS. 3a–3c show cross-sectional views for explaining a conventional method for etching the passivation layer covering the gate pad of the liquid crystal display as denoted by the line b—b of FIG. 1.
Figure 3B:
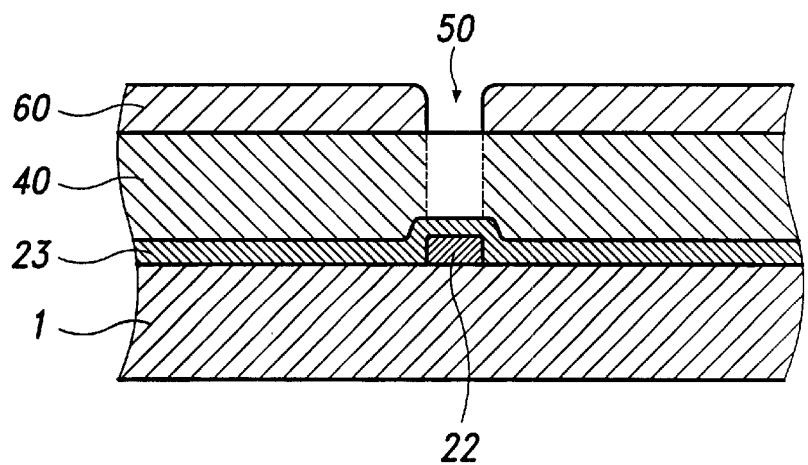
Figure 3C:
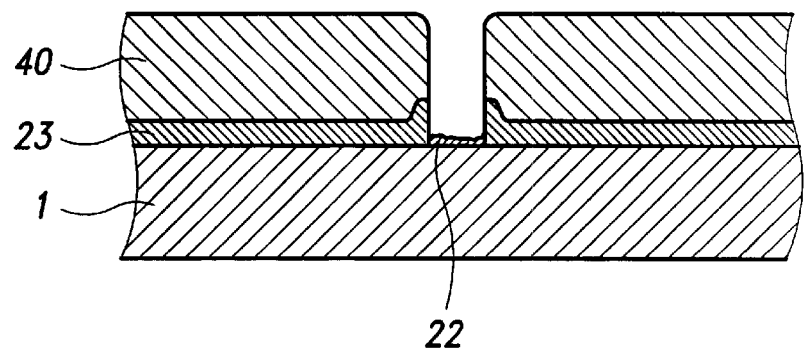
Figure 4A:
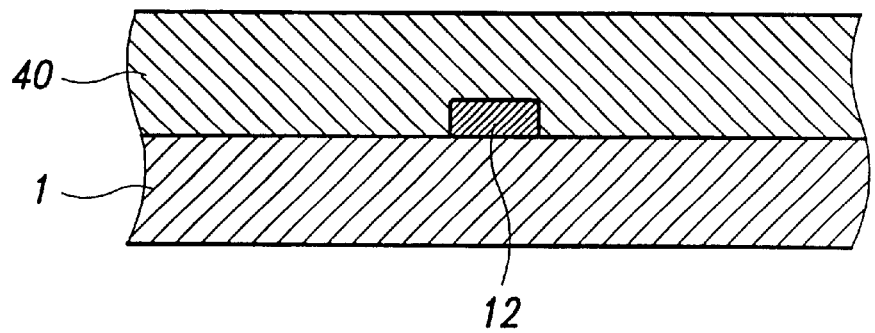
FIGS. 4a–4c show cross-sectional views for explaining a conventional method for etching the passivation layer covering the data pad of the liquid crystal display as denoted by the line c—c of FIG. 1.
Figure 4B:
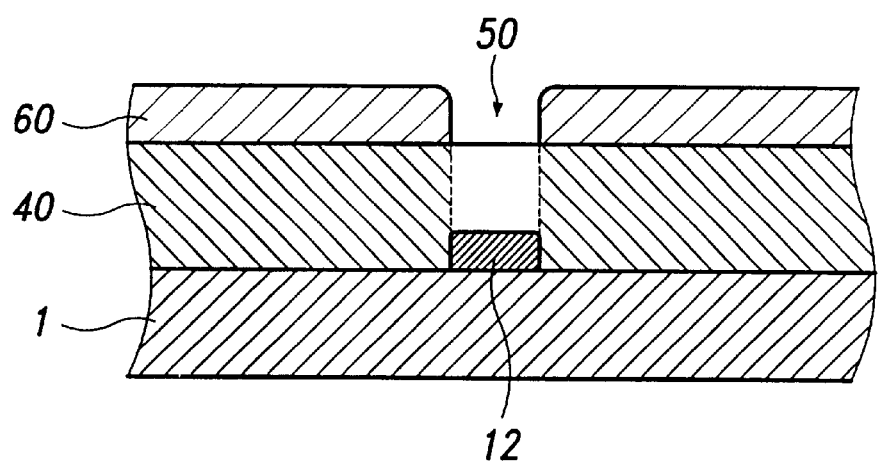
Figure 4C:
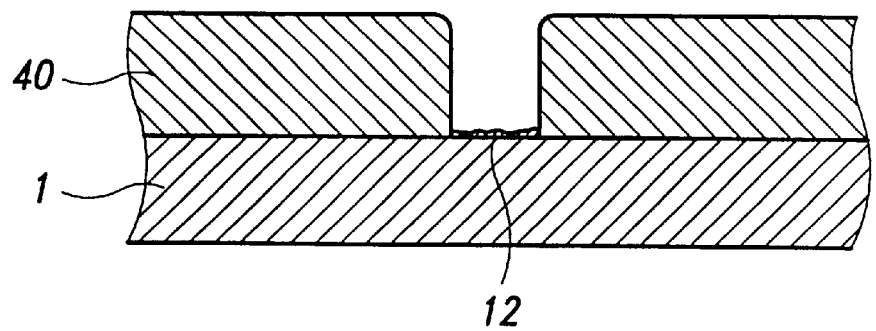
Figure 5A:
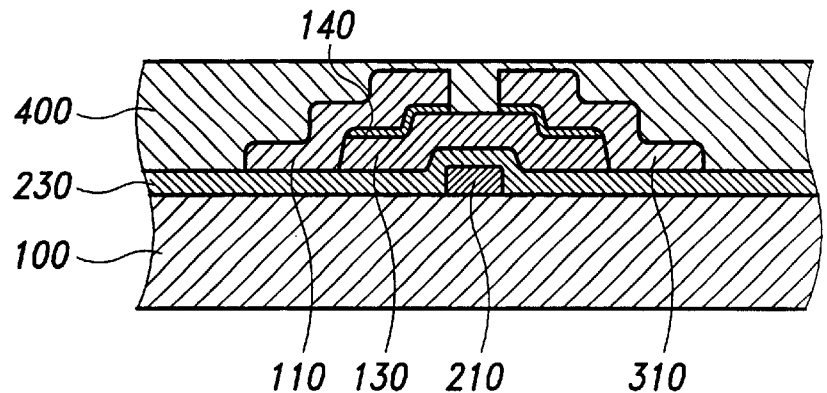
FIGS. 5a–5c show cross-sectional views for explaining a method for etching the passivation layer covering the switching element of the liquid crystal display according to a preferred embodiment of the present invention.
Figure 5B:
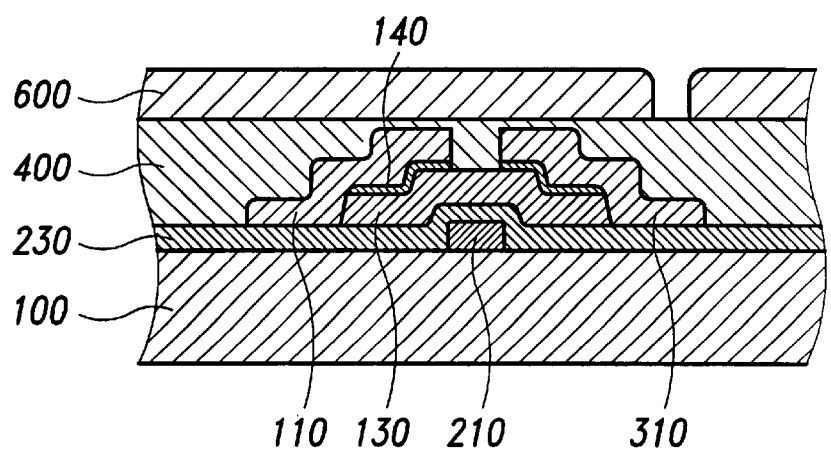
Figure 5C:
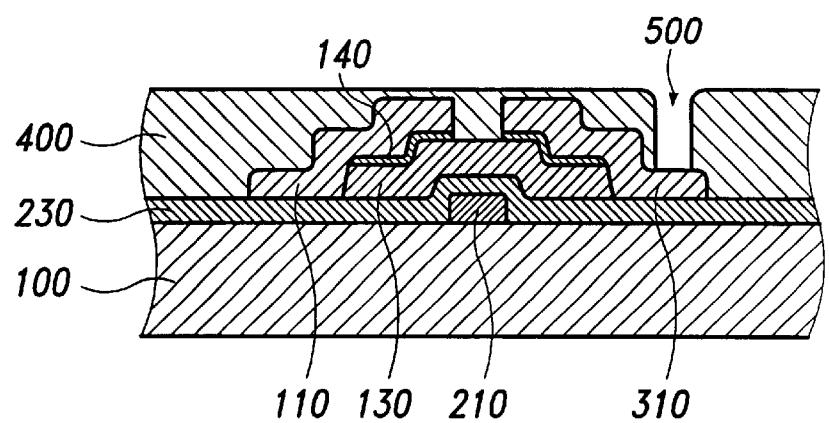

On the entire surface of the lower plate 100, a plurality of data lines (not shown) extending in the vertical direction are formed by depositing and patterning a refractory metal. At the same time, the source electrode 110 extending from the data bus line is formed on one side of the ohmic contact layer 140 as shown in FIGS. 5a–5c. The drain electrode 310 facing the source electrode 110 is also formed on the other side of the ohmic contact layer 140. At the start portion of the data bus line, a data pad 120 is formed as shown in FIGS. 7a–7c. The data pad 120 is connected to the output of the signal driver IC for generating a data signal of the picture.

After completing the above mentioned steps, the gate pad 220, the data pad 120 and a TFT switching element including the gate electrode 210, the semiconductor layer 130, the source electrode 110 and the drain electrode 310 are formed.

On the lower plate 100, a passivation layer 400 is formed over the TFT switching element, the gate pad 220 and the source pad 120 by depositing and/or coating an insulating material having an Si bonding structure such as $SiN_x$, $SiO_x$ or BCB, as shown in FIGS. 5a, 6a and 7a.

After coating a photo-resist 600 on the passivation layer 400, the photo-resist 600 is patterned using a mask of a predetermined shape. According to the shape of the mask, the patterned photo-resist exposes portions of the passivation layer 400 including some portions of the drain electrode 310, the gate pad 220 and the data pad 120, as shown in FIGS. 5b, 6b and 7b.

The lower plate 100 is then inserted into the etching chamber filled with $CF_4+H_2$ gas. The exposed portions of the passivation layer 400 are removed by being converted to a volatile gas such as $SiF_4$ resulting from the chemical reaction with the $CF_4+H_2$ gas. Here, the mixing ratio of the H2 gas to the CF4 gas can be variable and dependent on the area of the exposed passivation layer 400. By removing the exposed-portions of the passivation layer 400, contact holes 500, 500a and 500b are formed as shown in FIGS. 5c, 6c and 7 c. Through the contact holes, some portions of the drain electrode 310, the gate pad 220 and the data pad 120 are exposed. After that, the remaining portions of the photo-resist 600 are removed so that the etching step for the passivation layer 400 is completed.

On the entire surface of the passivation layer 400 having contact holes 500, 500a and 500b, an ITO (Indium Tin oxide) is deposited. On the ITO layer, a photo-resist is coated and is patterned using a mask having a predetermined shape. By etching the lower plate having the patterned photo-resist using an etching solution including HCl, a pixel electrode is connected to the drain electrode 310 and terminals for connecting the gate pad 120 and the data pad 220 to the outputs of the scan driver IC and the data driver IC, respectively are provided. The remaining photo-resist on the pixel electrode is removed by an organic solution including NMP (N-Methyl-Pyrrolidone), alcohol and amine.

For another preferred embodiment of the present invention, the etching gas for removing the exposed passivation layer 400 includes at least one of $SF_6+CHF_3$, $CF_4+CHF_3$, $CF_4+H_2+He$ and $CF_4+H_2+N_2$.

The present invention provides a further method for patterning a passivation layer using an etching gas including at least one of $SF_6+CHF_3$, $CF_4+CHF_3$, $CF_4+H_2+He$ and $CF_4+H_2+N_2$ instead of using $SF_6+O_2$ and $CF_4+O_2$ in the conventional method.

According to preferred embodiments of the present invention, when the exposed passivation layer 400 is removed by the chemical reaction with the etching gas including at least one selected from $SF_6+CHF_3$, $CF_4+CHF_3$, $CF_4+H_2+He$ and $CF_4+H_2+N_2$, the exposed drain electrode 310, the gate pad 220 and the data pad 120 are in contact with the etching gas. However, the etching ratio of the passivation layer to the refractory metal including the drain electrode 310, the gate pad 220 and the data pad 120 is about ten to one. So, the exposed refractory metal when the passivation layer is patterned is not damaged by the etching gas ($SF_6+CHF_3$, $CF_4+CHF_3$, $CF_4+H_2+He$ and $CF_4+H_2+N_2$).

According to the preferred embodiments of the present invention, because the refractory metal is not damaged by the etching gas, the electrical property of the contacting metal element to the refractory metal is excellent.

Furthermore, because the etching ratio of the insulating layer including an Si bond structure to the refractory metal is very high using the etching gas including one of $CF_4+H_2$, $SF_6+CHF_3$, $CF_4+CHF_3$, $CF_4+H_2+He$ and $CF_4+H_2+N_2$, a layer including the refractory metal is used as a mask for patterning the insulating layer.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of manufacturing a liquid crystal display including a substrate having a patterned metal layer, comprising:

providing the substrate, wherein the patterned metal layer comprises at least one material selected from the group consisting of Mo, Ta, Ti, MoSi and TiSi, and the substrate further comprises a low resistance metal layer located under the patterned metal layer;

forming an insulating layer on the substrate; and exposing at least one portion of the patterned metal layer by etching at least one portion of the insulating layer covering the patterned metal layer using at least one gas mixture selected from the group consisting of $CF_4+H_2$, $CF_4+H_2+He$, $CF_4+H_2+N_2$, $SF_6+CHF_3$ and $CF_4+CHF_3$, wherein a volume ratio among components of said at least one gas mixture depends on an area of the insulating layer that is exposed.

2. The method of claim 1, wherein the insulating layer comprises an Si bond structure.

3. The method of claim 2, wherein the insulating layer comprises at least one selected from the group consisting of $SiN_x$, $SiO_x$, and BCB (benzocyclobutene).

4. The method of claim 1, wherein the volume ratio of the $H_2$ gas to the $CF_4$ gas is about 1% to about 20% when the $CF_4+H_2$ gas mixture is used.

5. A method of manufacturing a liquid crystal display substrate including a switching element having a gate electrode, a source electrode, and a drain electrode, a data bus line connected to the source electrode and a gate bus line connected to the gate electrode, comprising:

forming a passivation layer covering the substrate including the switching element, the gate bus line and that data bus line; and exposing at least one portion of the drain electrode, a start portion of the gate bus line and the data bus line by etching at least one portion of the passivation layer using at least one of $CF_4+H_2$ gas mixture, $CF_4+H_2+He$ gas mixture, $CF_4+H_2+N_2$ gas mixture, $SF_6+CHF_3$ gas mixture and $CF_4+CHF_3$ gas mixture, wherein a volume ratio depends on an area of the passivation layer that is exposed.

6. The method of claim 5, wherein the passivation layer comprises an Si bonding structure.

7. The method of claim 6, wherein the gate bus line, the data bus line, the gate electrode, the source electrode and the drain electrode comprise a metal layer including at least one selected from the group consisting of Mo, Ta, Ti, MoSi, TaSi, and TiSi.

8. The method of claim 7, wherein the metal layer further comprises a low resistance metal layer located under the metal layer.

9. The method of claim 6, wherein the passivation layer comprises at least one selected from the group consisting of $SiN_x$, $SiO_x$, and BCB (Benzocyclobutene).

10. The method of claim 5, wherein the volume ratio of the $H_2$ gas to the $CF_4$ is about 1% to about 20% when the $CF_4+H_2$ mixture is used.

* * * * *